United States Patent
Sabut et al.

(10) Patent No.: US 8,253,482 B2
(45) Date of Patent: Aug. 28, 2012

(54) METHOD AND DEVICE FOR CONTROLLING A COMMON-MODE VOLTAGE OF A SWITCHED-CAPACITOR SYSTEM, IN PARTICULAR AN ANALOG-TO-DIGITAL CONVERTER

(75) Inventors: Marc Sabut, Eybens (FR); Hugo Gicquel, Grenoble (FR); Fabien Reaute, Renage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 96 days.

(21) Appl. No.: 12/813,972

(22) Filed: Jun. 11, 2010

(65) Prior Publication Data

US 2010/0321082 A1    Dec. 23, 2010

(30) Foreign Application Priority Data

Jun. 17, 2009  (FR) ...................... 09 54071

(51) Int. Cl.
*H03B 1/00* (2006.01)
*H03K 5/00* (2006.01)
*H04B 1/10* (2006.01)

(52) U.S. Cl. ............... 327/554; 327/306; 327/337
(58) Field of Classification Search .............. 327/306, 327/337, 554
See application file for complete search history.

(56) References Cited

U.S. PATENT DOCUMENTS

| | | | |
|---|---|---|---|
| 4,697,152 A | 9/1987 | Westwick | |
| 6,191,622 B1 | 2/2001 | Watson | |
| 6,998,917 B2 * | 2/2006 | Kudo et al. | 330/258 |
| 7,405,625 B1 | 7/2008 | Hensley et al. | |
| 2004/0021511 A1 | 2/2004 | Michalski | |
| 2008/0074189 A1 | 3/2008 | Singh et al. | |

OTHER PUBLICATIONS

Preliminary French Search Report, FR 0954071, Jan. 18, 2010.

* cited by examiner

*Primary Examiner* — John Poos
(74) *Attorney, Agent, or Firm* — Gardere Wynne Sewell LLP

(57) ABSTRACT

The common-mode voltage of a switched-capacitor system is controlled by determining a current common-mode voltage of the switched-capacitor system, converting (in a flow-through conduction cell) the difference between the current common-mode voltage and a desired common-mode voltage into a resultant current, and reinjecting this resultant current into the switched-capacitor system via a resistive path.

21 Claims, 3 Drawing Sheets

METHOD AND DEVICE FOR CONTROLLING A COMMON-MODE VOLTAGE OF A SWITCHED-CAPACITOR SYSTEM, IN PARTICULAR AN ANALOG-TO-DIGITAL CONVERTER

PRIORITY CLAIM

This application claims priority from French Application for Patent No. 09 54071 filed Jun. 17, 2009, the disclosure of which is incorporated by reference.

TECHNICAL FIELD

The invention relates to integrated circuits, and more particularly to the control of a common-mode level of a switched-capacitor system, in particular a switched-capacitor analog-to-digital converter.

BACKGROUND

In a switched-capacitor system, for example a switched-capacitor analog-to-digital converter, the input common mode is obtained, according to the prior art, by using a voltage generator generating the desired common-mode voltage, and by a set of two external resistors connected between the output of the generator and the differential inputs of the analog-to-digital converter. However, such an implementation suffers from a voltage drop at the external resistors because of the consumption of current at the input nodes of the analog-to-digital converter. This consumption originates from the leakage currents during the successive switchings of the switched-capacitor system and/or of the substrate current ("bulk") in the transistors used as switches.

Because of this, the common-mode voltage at the inputs of the analog-to-digital converter may be significantly different from the desired common-mode voltage, this difference being able to be of the order of a few hundreds of millivolts.

SUMMARY

According to one method of application and embodiment, a control method and device are proposed making it possible to lock the common-mode voltage at the differential inputs of the switched-capacitor system to the desired common-mode voltage.

According to another method of application and embodiment, it is also proposed to make such a lock-in independent of the switching frequency of the switches of the switched-capacitor system.

According to one aspect, a method is proposed for controlling a common-mode voltage of a switched-capacitor system comprising detection of the current common-mode voltage of the switched-capacitor system, a conversion, in a flow-through conduction cell, of the difference between the current common-mode voltage and a desired common-mode voltage into a resultant current, and a reinjection of this resultant current into the switched-capacitor system via a resistive path.

Therefore, according to this aspect, the current common-mode voltage is locked into the desired voltage or setpoint voltage, while compensating for the current absorbed by the switched-capacitor system.

According to one method of application, it is particularly advantageous to carry out the conversion with a flow-through conduction cell having a flow-through conduction proportional to the switching frequency of the switched-capacitor system. Specifically, this makes it possible to obtain a voltage gain independent of the switching frequency. Moreover, this gain which is kept constant is advantageously chosen to be sufficiently high to maintain a low static gain error irrespective of the current absorbed by the switched-capacitor system.

The invention applies advantageously, but is not limited, to controlling the common-mode voltage of a switched-capacitor analog-to-digital converter.

According to another aspect, a device is proposed for controlling a common-mode voltage of a switched-capacitor system, comprising: detection means configured to deliver the current common-mode voltage of the switched-capacitor system, generation means configured to generate a desired common-mode voltage, a flow-through conduction cell having a first cell input coupled to the output of the detection means, a second cell input coupled to the output of the generation means and a cell output looped to the switched-capacitor system via a resistive path.

According to one embodiment, the flow-through conduction of the flow-through conduction cell is proportional to the switching frequency of the switched-capacitor system.

According to one embodiment, the flow-through conduction cell comprises a flow-through conduction stage having a first input and a second input respectively coupled to the first cell input and to the second cell input, and additional means coupled to the second input and configured to emulate the current absorbed by the switched-capacitor system taking account of the switching frequency.

According to one embodiment, the additional means comprise a capacitor coupled to the second input of the flow-through conduction stage, the capacitive value of which is proportional to the input capacitive value of the switched-capacitor system and control means configured in order successively to charge and discharge the capacitor at the switching frequency.

According to one embodiment, the flow-through conduction cell comprises a transistor the control electrode of which forms the second cell input, and the generation means comprise a resistive bridge the mid-point of which is connected to the transistor control electrode.

According to one embodiment, the detection means comprise a capacitive network having two terminals and a mid-point connected to earth and management means configured to connect the two terminals of the capacitive network to the input terminals of the switched-capacitor system, then to short-circuit the capacitive network by connecting together the two terminals of the capacitive network, the two terminals thus connected forming the output of the detection means.

Such an embodiment makes it possible to obtain detection means which consume no current while providing no impedance on the input nodes of the switched-capacitor system. Moreover, such detection means provide no noise in the detection of the signal.

According to another aspect, a switched-capacitor analog-to-digital converter is proposed comprising a control device as defined above.

According to yet another aspect, a wireless communication apparatus is proposed, for example a cellular mobile telephone, comprising an analog-to-digital converter as defined above.

BRIEF DESCRIPTION OF THE DRAWINGS

Other advantages and features of the invention will appear on examination of the detailed description of methods of application and embodiments, which are in no way limiting, and of the appended drawings in which.

DETAILED DESCRIPTION OF THE DRAWINGS

Figure 1:
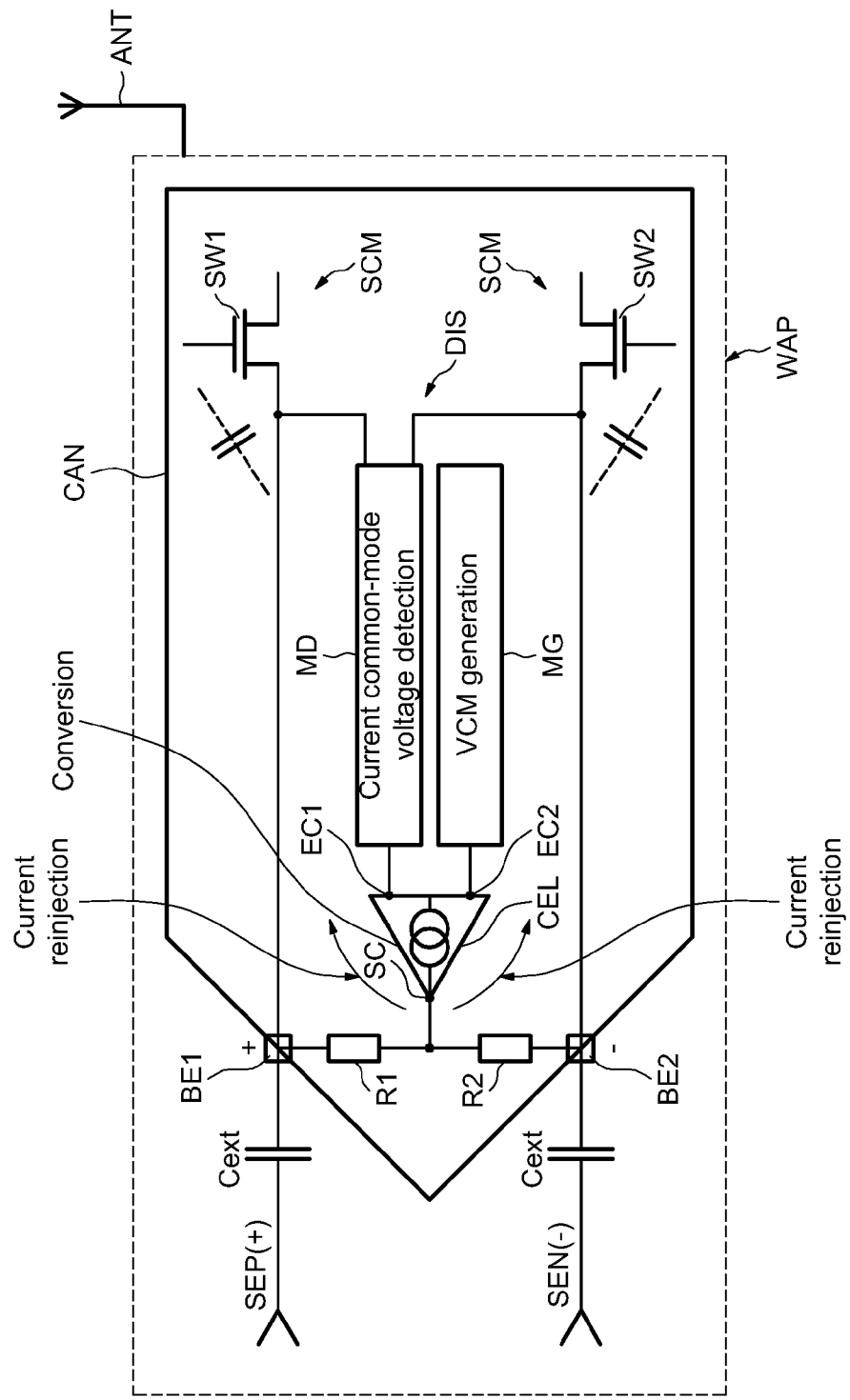
FIG. 1 illustrates very schematically an embodiment of a control device allowing the application of a control method.

In FIG. 1, the reference ADC indicates an analog-to-digital converter comprising a switched-capacitor system SCM.

This analog-to-digital converter is for example incorporated into the reception chain of a wireless communication apparatus WAP, for example a cellular mobile telephone, fitted with an antenna ANT.

The analog-to-digital converter receives an input signal, in this instance a differential input signal SEP(+), SEN(−) on the two input terminals BE1 and BE2 of the ADC converter. The capacitors Cext embody the capacitors external to the converter ADC.

The converter ADC incorporates a device DIS designed to control the input common-mode voltage of the switched-capacitor system of the converter ADC.

This device DIS comprises means MD configured to detect (determine) the current common-mode voltage of the switched-capacitor system SCM, and generation means MG configured to generate a desired common-mode voltage, or setpoint voltage, VCM.

The device DIS moreover comprises a flow-through conduction cell CEL having a first cell input EC1 to receive the current common-mode voltage, and a second cell input EC2 to receive the setpoint voltage VCM.

The flow-through conduction cell also has a cell output SC looped to the two input terminals BE1 and BE2, and consequently to the switched-capacitor system SCM, via a resistive path comprising in this instance two resistors R1 and R2.

Therefore, in operation, the flow-through conduction cell CEL carries out a conversion of the difference between the current common-mode voltage of the switched-capacitor system and the desired common-mode voltage VCM, into a resultant current. This resultant current is then reinjected into the switched-capacitor system via the resistive path R1, R2.

In other words, this produces a locking-in of the current common-mode voltage of the switched-capacitor system, and consequently of the converter ADC, to the setpoint voltage VCM, with a compensation for the current absorbed by the analog-to-digital converter.

Figure 2:
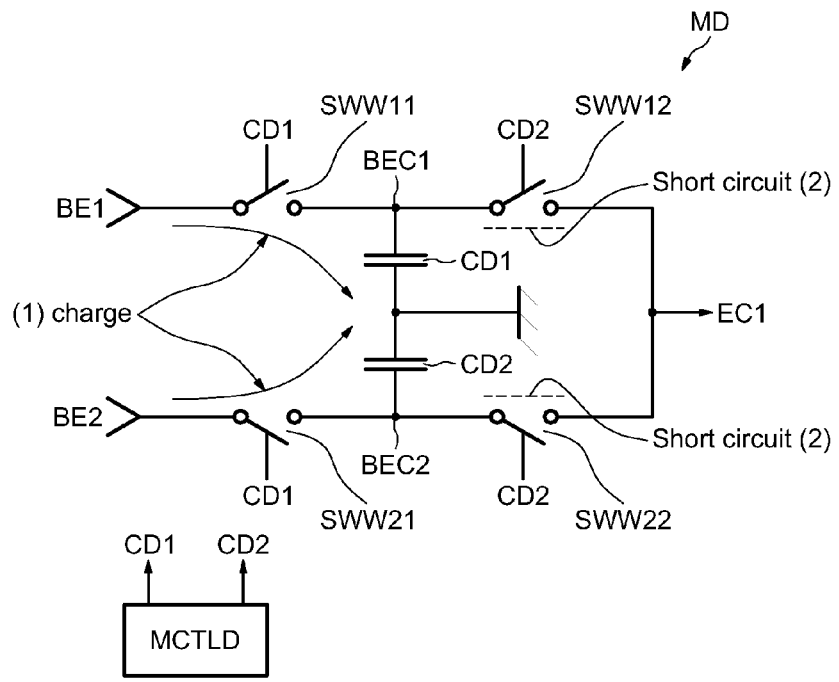
FIG. 2 illustrates in greater detail and still schematically an exemplary embodiment of means for detecting the current common-mode voltage.

Although several solutions are possible for producing the detection means MD, in particular the use of a resistive bridge, it is particularly advantageous to use the embodiment illustrated in FIG. 2.

More precisely, the detection means MD comprise, in this instance, a capacitive network comprising two capacitors CD1 and CD2 each having a terminal connected to earth/ground. The other terminal BEC1 of the capacitor CD1 is connected to the input terminal BE1 via a switch SWW11 controlled by a control signal CD1.

The other terminal BEC2 of the capacitor CD2 is connected to the terminal BE2 via a switch SWW21 also controlled by the control signal CD1.

Moreover, the terminal BEC1 is also connected to the first cell input EC1 via a switch SWW12 controlled by a control signal CD2.

The terminal BEC2 is also connected to the cell input EC1 via a switch SWW22 also controlled by the control signal CD2.

A control block MCTLD, produced for example with the aid of logic circuits, is configured to deliver the logic control signals CD1 and CD2. The block MCTLD and the various switches SWW11, SWW12, SWW21 and SWW22 form management means which are configured, initially, to connect the two terminals BEC1, BEC2 of the capacitive network CD1, CD2 to the input terminals BE1, BE2 of the converter ADC (switches SWW11 and SWW21 closed and switches SWW12 and SWW22 open) then, secondly, to short-circuit the capacitive network CD1, CD2 by connecting together the two terminals BEC1, BEC2 of this capacitive network (switches SWW12 and SWW22 closed and switches SWW11 and SWW21 open). The two terminals BEC1 and BEC2 thus connected therefore form the output of the detection means MD.

The switching frequency of the switches of the means MD is equal to the switching frequency Fck of the switched-capacitor system.

Therefore, in phase 1, there is a charging of the two capacitors CD1 and CD2 then, in phase 2, an exchange of charge between the two capacitors, caused by the short-circuiting of the latter.

In the second phase, the two terminals BEC1 and BEC2 connected together deliver the current common-mode voltage.

Such an embodiment provides no impedance on the terminals BE1 and BE2. This therefore results in no consumption of current. Also, such a device provides no noise on the signal.

The current absorbed by the analog-to-digital converter is proportional to the switching frequency Fck of the capacitors of the switched-capacitor system SCM. More precisely, this current i is equal to:

$$i = Vcm/(1/C \cdot Fck) \quad (I)$$

in which Vcm indicates the current common-mode voltage, C indicates the capacitive value of the switched-capacitor system and Fck is the switching frequency of the switched-capacitor system.

It is therefore particularly advantageous that the flow-through conduction cell CEL can have a flow-through conduction proportional to the switching frequency of the switched-capacitor system, in order to maintain a constant voltage gain.

Figure 3:
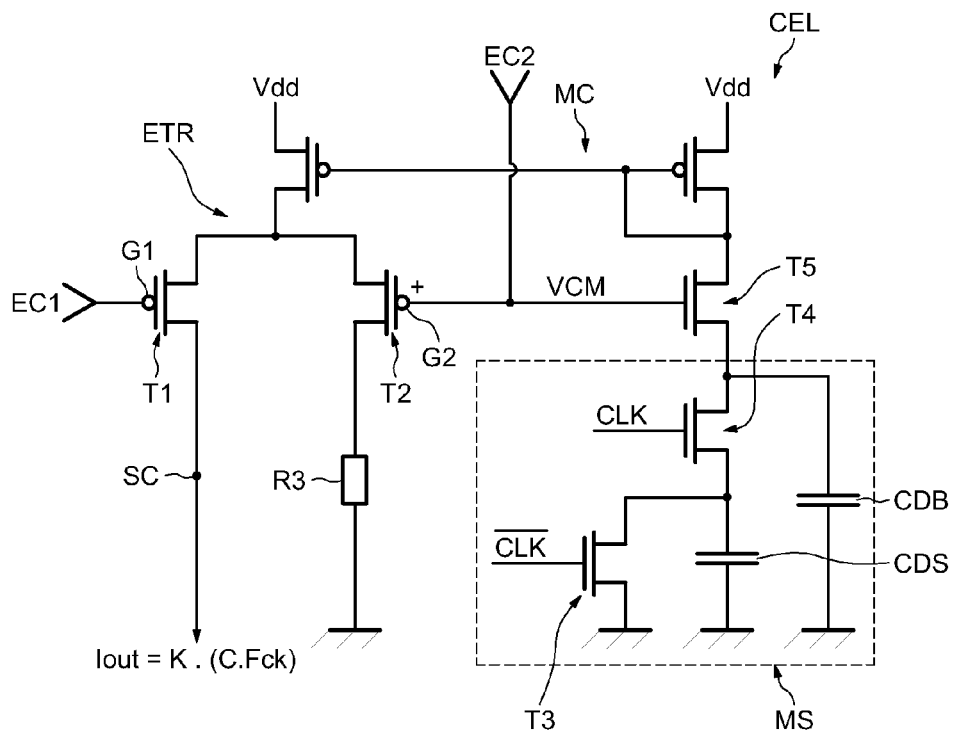
FIG. 3 illustrates in greater detail an exemplary embodiment of a flow-through conduction cell of a control device according to the invention.

The embodiment of FIG. 3 makes it possible to offer a flow-through conduction cell CEL having a flow-through conduction proportional to the frequency Fck.

More precisely, this cell CEL comprises a flow-through conduction stage ETR having two PMOS transistors T1 and T2 the gates of which G1 and G2 form respectively a first input and a second input that are respectively coupled to the first cell input EC1 and to the second cell input EC2.

The flow-through conduction cell CEL furthermore comprises additional means MS coupled to the gate G2 and configured to emulate the current absorbed by the switched-capacitor system taking account of the switching frequency.

More precisely, the additional means MS comprise in this instance a capacitor CDS the capacitive value of which is proportional to the input capacitive value of the switched-capacitor system. It is possible, for example, to take a capacitive value for the capacitor CDS that is approximately 20 to 50 times smaller than the input capacitive value of the switched-capacitor system.

Moreover, the capacitor CDS is designed to be successively charged and discharged at the switching frequency Fck by control means comprising, in this instance, two NMOS transistors T3 and T4 operating as switches, and respectively controlled by control signals $\overline{CLK}$ and CLK at the speed of the switching frequency Fck. The means MS moreover comprise a capacitor CDB forming ballast, and designed to create a perfect voltage generator.

The capacitor CDS is connected to the gate G2 of the transistor T2 via an NMOS transistor T5.

Finally, the cell CEL comprises a current mirror MC.

The output current Tout of the cell CEL is proportional (K) to the product C·Fck where C is the capacitor of the switched-capacitor system.

Consequently, since this output current is proportional to the switching frequency Fck, the flow-through conduction Gm of this cell is also proportional to the switching frequency.

The voltage gain is defined by the formula (II) below:

$$\text{Gain} = GM\left(\frac{1}{C \cdot Fck}\right) \quad (II)$$

This formula (II) can also be written in the following form:

$$\text{Gain} = \frac{\alpha \cdot Iout}{(Vgs - Vt)} \times \left(\frac{1}{C \cdot Fck}\right) \quad (III)$$

in which α designates a coefficient of proportionality that is a function of the technology used (1.3<α<2), Vgs is the source gate voltage of the transistor T1 and Vt is the threshold voltage, or else by the formula (IV) below:

$$\text{Gain} = \frac{\alpha \cdot K \cdot (C \cdot Fck)}{(Vgs - Vt)} \times \left(\frac{1}{C \cdot Fck}\right) \quad (IV)$$

in which K is a function of the voltage VCM and the voltage Vgs of the transistor T5 (K=VCM−Vgs(T5)).

It can therefore be seen that, in this formula (IV), the terms C·Fck cancel out, which makes the voltage gain independent of the switching frequency Fck.

Moreover, the user will advantageously choose this gain to be sufficiently high to maintain a low static gain error irrespective of the value of the current absorbed by the analog-to-digital converter. A value of 50 to 100 is amply sufficient.

Figure 4:
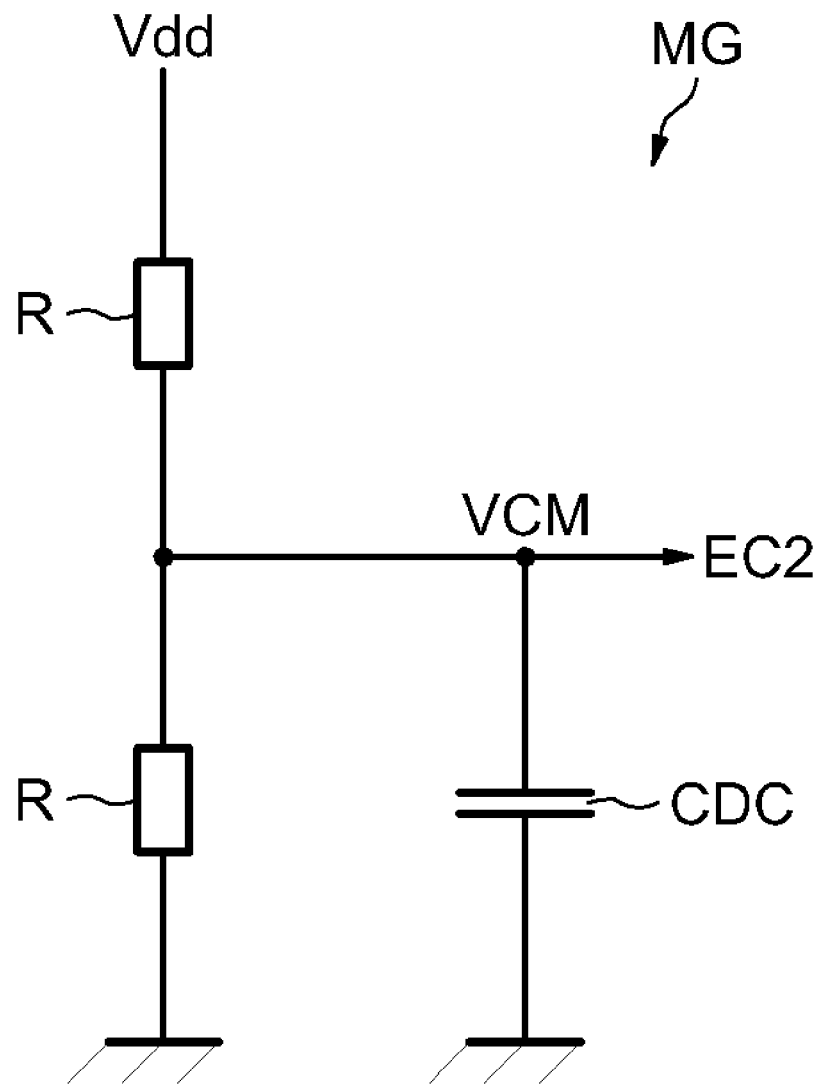
FIG. 4 illustrates schematically an example of a generator of a desired common-mode voltage.

FIG. 4 illustrates a possible embodiment of means for generating the setpoint voltage VCM. More precisely, a simple voltage divider produced by a resistive bridge R, R connected between the supply voltage Vdd and earth/ground, makes it possible to deliver the voltage VCM since no current is drawn from these means MG because they are connected only to the transistor gates. The capacitor CDC is a decoupling capacitor which makes it possible to avoid the supply of high-frequency variations.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for controlling a common-mode voltage of a switched-capacitor system, comprising
    determining a current common-mode voltage at a differential input of the switched-capacitor system;
    converting a difference between the current common-mode voltage and a desired common-mode voltage into a resultant current; and
    reinjecting the resultant current into the differential input of the switched-capacitor system via a resistive path.

2. The method according to claim 1, wherein converting is carried out with a flow-through conduction cell having a flow-through conduction proportional to a switching frequency of the switched-capacitor system.

3. The method according to claim 1, wherein the switched-capacitor system is a switched-capacitor analog-to-digital converter.

4. A device for controlling a common-mode voltage of a switched-capacitor system, comprising:
    a detector circuit configured to detect a current common-mode voltage at a differential input of the switched-capacitor system;
    a generator circuit configured to generate a desired common-mode voltage;
    a flow-through conduction cell having a first cell input coupled to an output of the detector circuit and a second cell input coupled to the output of the generator circuit; and
    a resistive path coupled to loop an output of the flow-through conduction cell to the differential input of the switched-capacitor system.

5. The device according to claim 4, wherein a flow-through conduction of the flow-through conduction cell is proportional to a switching frequency of the switched-capacitor system.

6. The device according to claim 5, wherein the flow-through conduction cell comprises:
    a flow-through conduction stage having a first input and a second input respectively coupled to the first cell input and to the second cell input; and
    an emulation circuit coupled to the second input and configured to emulate a current absorbed by the switched-capacitor system taking account of the switching frequency.

7. The device according to claim 6, wherein the emulation circuit comprises:
    a capacitor coupled to the second input of the flow-through conduction stage, the capacitor having a capacitive value proportional to an input capacitive value of the switched-capacitor system; and
    a control circuit configured to successively charge and discharge the capacitor at the switching frequency.

8. The device according to claim 4, wherein the flow-through conduction cell comprises:
    a transistor having a control electrode providing the second cell input; and
    wherein the generator circuit comprises a resistive bridge having a mid-point connected to the transistor control electrode.

9. The device according to claim 4, wherein the switched-capacitor system is a switched-capacitor analog-to-digital converter.

10. The device according to claim 9, wherein the switched-capacitor analog-to-digital converter is a component of a wireless communication apparatus.

11. A device for controlling a common-mode voltage of a switched-capacitor system, comprising:

a detector circuit configured to detect a current common-mode voltage of the switched-capacitor system;

a generator circuit configured to generate a desired common-mode voltage;

a flow-through conduction cell having a first cell input coupled to an output of the detector circuit and a second cell input coupled to the output of the generator circuit; and a resistive path coupled to loop an output of the flow-through conduction cell to the switched-capacitor system;

wherein the detector circuit comprises:
- a capacitive network having two terminals and a midpoint terminal, wherein the midpoint terminal is connected to a ground node; and
- a management circuit configured to connect the two terminals of the capacitive network to the input terminals of the switched-capacitor system in a first switching phase, and configured to short-circuit the capacitive network by connecting together the two terminals of the capacitive network to each other in a second switching phase; and wherein the two terminals are connected to each other at a node forming an output of the detector circuit.

12. A circuit, comprising:
a differential input including a positive input node and a negative input node;

a first resistor and second resistor connected at a common node, the first and second resistors coupled in series between the positive input node and the negative input node;

a common mode voltage detector circuit coupled to the positive input node and the negative input node, the common mode voltage detector circuit configured to output a current common-mode voltage;

a generator configured to generate a desired common mode voltage;

a voltage to current converter circuit configured to convert a difference between the current common-mode voltage and the desired common-mode voltage into an output current at an output node, that output node being connected to the common node of the series connected first resistor and second resistor.

13. The circuit of claim 12 further including:
a first input capacitor coupled to the positive input node; and
a second input capacitor coupled to the negative input node;
wherein the first and second input capacitors receive a differential input signal.

14. The circuit of claim 12 wherein the generator configured to generate a desired common mode voltage comprises a resistive voltage divider circuit.

15. The circuit of claim 12 wherein the common mode voltage detector circuit comprises:
a capacitive network having two terminals and a mid-point terminal, wherein the midpoint terminal is connected to a ground node; and
a management circuit configured to connect the two terminals of the capacitive network respectively to the positive input node and the negative input node in a first switching phase, and configured to short-circuit the capacitive network by connecting the two terminals of the capacitive network to each other in a second switching phase;

wherein the two terminals are connected to each other at a node forming an output of the detector circuit which is applied to an input of the voltage to current converter circuit.

16. The circuit of claim 12, wherein the voltage to current converter circuit comprises:
a flow-through conduction stage having a first input receiving the current common-mode voltage and a second input receiving the desired common-mode voltage; and
an emulation circuit coupled to the second input and configured to emulate an absorbed current from the positive input node and the negative input node taking into account a clock switching frequency.

17. The circuit of claim 16, wherein the flow-through conduction stage comprises a first transistor having a first conduction path and a control terminal coupled to the first input, and a second transistor having a second conduction path and a control terminal coupled to the second input, wherein the first and second conduction paths are connected together at a tail current source transistor, and the first conduction path supplies the output current.

18. The circuit of claim 17, wherein the voltage to current converter circuit further comprises a current mirror transistor coupled to the tail current source and configured to supply current to the emulation circuit.

19. The circuit of claim 17, wherein the emulation circuit comprises:
third and fourth transistors having control terminals coupled to receive opposite phases of a clock signal;
a ballast capacitor coupled between a first conduction terminal of the third transistor and a reference voltage node;
a charging capacitor coupled between a second conduction terminal of the third transistor and the reference voltage;
wherein a first conduction terminal of the fourth transistor is coupled to the second conduction terminal of the third transistor and a second conduction terminal of the fourth transistor is coupled to the reference voltage.

20. A device for controlling a common-mode voltage of a switched-capacitor system, comprising:
a detector circuit configured to detect a current common-mode voltage of the switched-capacitor system;
a generator circuit configured to generate a desired common-mode voltage;
a flow-through conduction cell having a first cell input coupled to an output of the detector circuit and a second cell input coupled to the output of the generator circuit; and
a resistive path coupled to loop an output of the flow-through conduction cell to the switched-capacitor system;
wherein the flow-through conduction cell comprises:
- a flow-through conduction stage having a first input and a second input respectively coupled to the first cell input and to the second cell input; and
- an emulation circuit coupled to the second input and configured to emulate a current absorbed by the switched-capacitor system taking account of the switching frequency.

21. A circuit, comprising:
a differential input including a positive input node and a negative input node;
a common mode voltage detector circuit coupled to the positive input node and the negative input node, the common mode voltage detector circuit configured to output a current common-mode voltage at the differential input;

a generator configured to generate a desired common mode voltage;

a voltage to current converter circuit configured to convert a difference between the current common-mode voltage and the desired common-mode voltage into an output current; and a feedback circuit coupling the output current to the differential input.

* * * * *

UNITED STATES PATENT AND TRADEMARK OFFICE
CERTIFICATE OF CORRECTION

| | | |
|---|---|---|
| PATENT NO. | : 8,253,482 B2 | Page 1 of 1 |
| APPLICATION NO. | : 12/813972 | |
| DATED | : August 28, 2012 | |
| INVENTOR(S) | : Marc Sabut et al. | |

It is certified that error appears in the above-identified patent and that said Letters Patent is hereby corrected as shown below:

In the Specification:

At column 5, line number 10, please replace [Tout] with -- Iout --.

Signed and Sealed this
Twenty-third Day of October, 2012

David J. Kappos
*Director of the United States Patent and Trademark Office*

UNITED STATES PATENT AND TRADEMARK OFFICE
CERTIFICATE OF CORRECTION

PATENT NO. : 8,253,482 B2  
APPLICATION NO. : 12/813972  
DATED : August 28, 2012  
INVENTOR(S) : Marc Sabut et al.

Page 1 of 1

It is certified that error appears in the above-identified patent and that said Letters Patent is hereby corrected as shown below:

In the Specification:

At column 5, line number 10, please replace [Tout] with -- Iout --.

This certificate supersedes the Certificate of Correction issued October 23, 2012.

Signed and Sealed this  
First Day of January, 2013

David J. Kappos  
*Director of the United States Patent and Trademark Office*